(12) United States Patent
Lee et al.

(10) Patent No.: US 9,761,182 B2
(45) Date of Patent: Sep. 12, 2017

(54) FOLDABLE DISPLAY APPARATUS

(71) Applicant: LG DISPLAY CO., LTD., Seoul (KR)

(72) Inventors: Dal Jae Lee, Seoul (KR); Ji Sun Park, Mokpo-si (KR)

(73) Assignee: LG Display Co., Ltd., Seoul (KR)

( * ) Notice: Subject to any disclaimer, the term of this patent is extended or adjusted under 35 U.S.C. 154(b) by 83 days.

(21) Appl. No.: 14/582,730

(22) Filed: Dec. 24, 2014

(65) Prior Publication Data

US 2015/0255023 A1    Sep. 10, 2015

(30) Foreign Application Priority Data

Mar. 7, 2014    (KR) .................. 10-2014-0027393

(51) Int. Cl.
| | | |
|---|---|---|
| *G09G 5/00* | (2006.01) | |
| *G09G 3/36* | (2006.01) | |
| *H05K 1/02* | (2006.01) | |
| *H05K 5/00* | (2006.01) | |
| *H05K 5/02* | (2006.01) | |
| *G06F 1/16* | (2006.01) | |
| *G09F 9/30* | (2006.01) | |

(52) U.S. Cl.
CPC ............ *G09G 3/36* (2013.01); *G06F 1/1616* (2013.01); *G06F 1/1652* (2013.01); *G06F 1/1681* (2013.01); *G09F 9/301* (2013.01); *H05K 1/028* (2013.01); *H05K 5/0017* (2013.01); *H05K 5/0021* (2013.01); *H05K 5/0226* (2013.01); *G09G 2320/0686* (2013.01); *G09G 2380/02* (2013.01)

(58) Field of Classification Search
CPC ...... G06F 1/1652; G06F 1/1635; G06F 1/166; G06F 1/1681; G06F 3/0412; H05K 5/0226; H05K 5/0617; H05K 1/028
USPC .................................. 345/1.1, 1.3; 361/749
See application file for complete search history.

(56) References Cited

U.S. PATENT DOCUMENTS

| | | | | |
|---|---|---|---|---|
| 8,692,735 | B2 * | 4/2014 | Kawashimo | ............. G09G 3/20 345/1.1 |
| 2010/0085382 | A1 | 4/2010 | Lundqvist et al. | |
| 2010/0277443 | A1 * | 11/2010 | Yamazaki | ............. G06F 1/1616 345/204 |
| 2012/0008267 | A1 | 1/2012 | Watanabe | |
| 2012/0113614 | A1 * | 5/2012 | Watanabe | ........... G02F 1/13336 361/810 |

(Continued)

FOREIGN PATENT DOCUMENTS

| | | |
|---|---|---|
| CN | 102150099 A | 8/2011 |
| CN | 102341840 A | 2/2012 |

(Continued)

*Primary Examiner* — Jennifer Nguyen
(74) *Attorney, Agent, or Firm* — Birch, Stewart, Kolasch & Birch, LLP

(57) ABSTRACT

A foldable display apparatus that may realize one seamless screen by using two display panels is discussed. The foldable display apparatus can include a first display panel having a first display area; a second display panel having a second display area; and a panel supporter supporting the first and second display panels to mutually fold or unfold the first and second display panels, wherein boundary portions of the first display area of the first display panel and the second display area of the second display panel are matched with each other in a state that the first and second display panels are unfolded.

20 Claims, 8 Drawing Sheets

(56) References Cited

U.S. PATENT DOCUMENTS

| | | | |
|---|---|---|---|
| 2012/0249601 A1 | 10/2012 | Kawashimo et al. | |
| 2013/0076597 A1* | 3/2013 | Becze | G06F 3/1438 345/1.3 |
| 2014/0029212 A1 | 1/2014 | Hwang et al. | |
| 2014/0098037 A1* | 4/2014 | Lee | G06F 3/041 345/173 |

FOREIGN PATENT DOCUMENTS

| | | |
|---|---|---|
| CN | 203287832 U | 11/2013 |
| KR | 10-2013-0120703 A | 11/2013 |
| KR | 10-2014-0015881 A | 2/2014 |

* cited by examiner

FOLDABLE DISPLAY APPARATUS

CROSS REFERENCE TO RELATED APPLICATIONS

This application claims the priority benefit of the Korean Patent Application No. 10-2014-0027393 filed on Mar. 7, 2014, which is hereby incorporated by reference for all purposes as if fully set forth herein.

BACKGROUND OF THE INVENTION

Field of the Invention

The present invention relates to a foldable display apparatus, and more particularly, to a foldable display apparatus that may minimize stress given to a bending area of a display panel.

Discussion of the Related Art

Generally, a display apparatus based on a flat panel display panel, such as a liquid crystal display ("LCD"), a field emission display ("FED"), an organic light-emitting display, or an electrophoretic display, and an electro-wetting display, is mainly applied to notebook computers, portable electronic devices, televisions ("TVs"), or monitors.

Recently, as the demand for a large screen in portable electronic devices increases, devices realizing a large display screen through a connection with a flat panel display panel have been developed and are available in the market. Particularly, a foldable display apparatus based on an advantage of a flexible display panel which may be bent or folded has received much attention as the next generation technology in the field of display owing to a display of a large scaled screen with portable convenience. The foldable display apparatus may be applied to not only mobile devices, such as mobile terminals, e-diaries, e-books, portable multimedia players ("PMPs"), navigation systems, ultra mobile personal computers ("UMPCs"), mobile phones, smart phones, and tablet personal computers (PCs), but also to various fields, such as TVs and monitors.

An example of the above foldable display apparatus is disclosed in the Korean Laid-Open Patent No. 10-2014-0015881 (hereinafter, referred to as "background art reference").

The foldable display apparatus disclosed in the background art reference provides a large screen by unfolding a flexible display panel on the basis of a hinge unit.

However, in the background art reference, as the flexible display panel is repeatedly folded and unfolded on the basis of the hinge unit, stress occurs, whereby crack occurs in a bending area of the flexible display panel due to the stress. As a result, a problem occurs in that reliability of the flexible display panel is deteriorated. That is, in the background art reference, since one side area and the other side area of the flexible display panel are fully folded to adjoin each other on the basis of the bending area, it is likely that crack occurs in the bending area of the flexible display panel.

SUMMARY OF THE INVENTION

Accordingly, the present invention is directed to a foldable display apparatus that substantially obviates one or more problems due to limitations and disadvantages of the related art.

An advantage of the present invention is to provide a foldable display apparatus that may realize one seamless screen by using two display panels.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a foldable display apparatus according to one embodiment of the present invention comprises a first display panel having a first display area; a second display panel having a second display area; and a panel supporter supporting the first and second display panels to mutually fold or unfold the first and second display panels, wherein boundary portions of the first display area of the first display panel and the second display area of the second display panel are matched with each other in a state that the first and second display panels are unfolded.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Terms disclosed in this specification should be understood as follows.

The term of a singular expression should be understood to include a multiple expression as well as the singular expression if there is no specific definition in the context. The terms such as "the first" and "the second" are used only to differentiate one element from other elements. Thus, a scope of claims is not limited by these terms.

Also, it should be understood that the term such as "include" or "have" does not preclude existence or possibility of one or more features, numbers, steps, operations, elements, parts or their combinations.

It should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on or above" a second element, it should be understood that the first and second elements may be brought into contact with each other, or a third element may be interposed between the first and second elements.

Hereinafter, a foldable display apparatus according to the preferred embodiments of the present invention will be described in detail with reference to the accompanying drawings.

Figure 1:
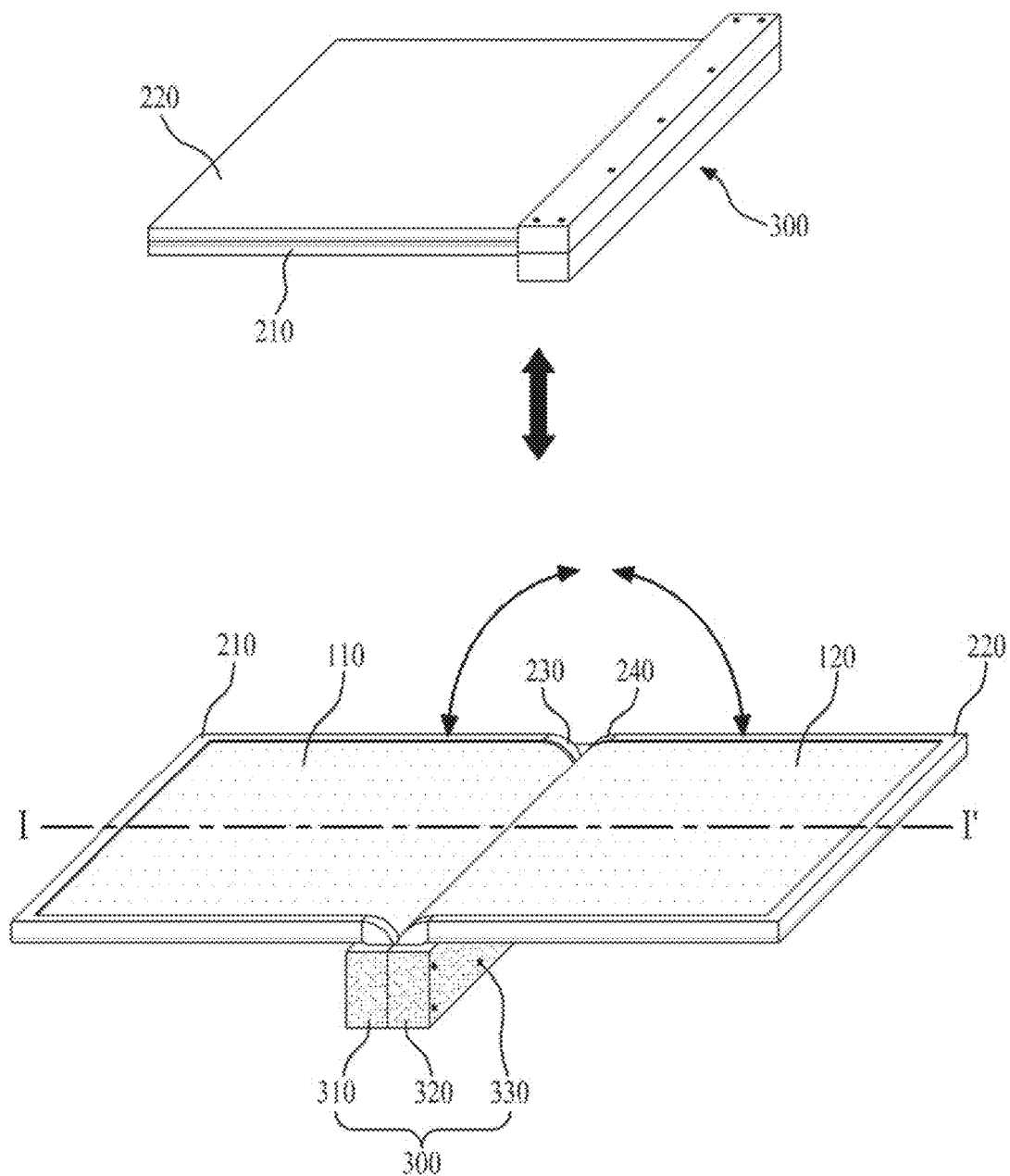
FIG. 1 is a diagram illustrating a folded state and an unfolded state of a foldable display apparatus according to a first embodiment of the present invention.
Figure 2:
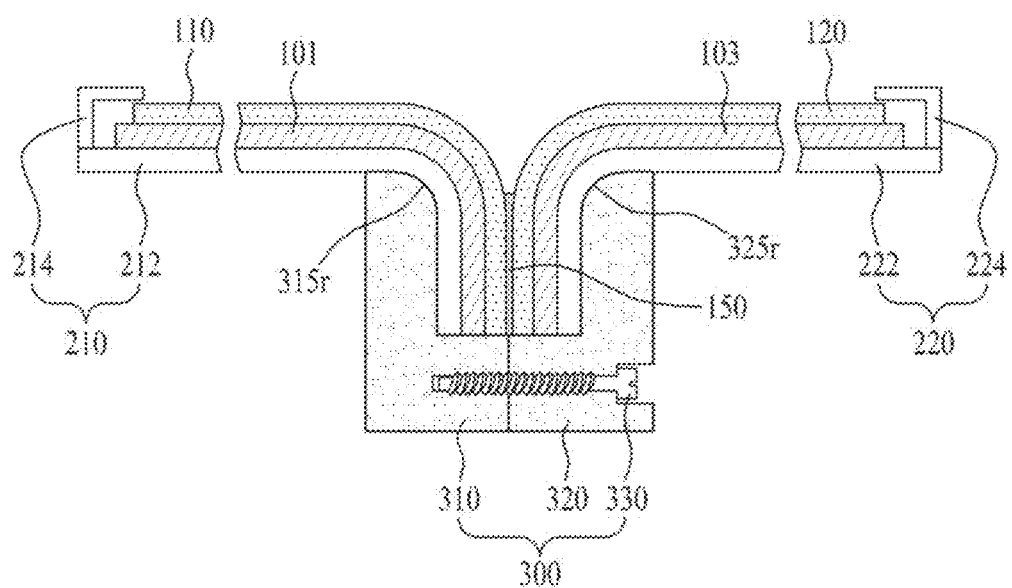
FIG. 2 is a cross-sectional diagram taken along line IT shown in FIG. 1.
Figure 3:
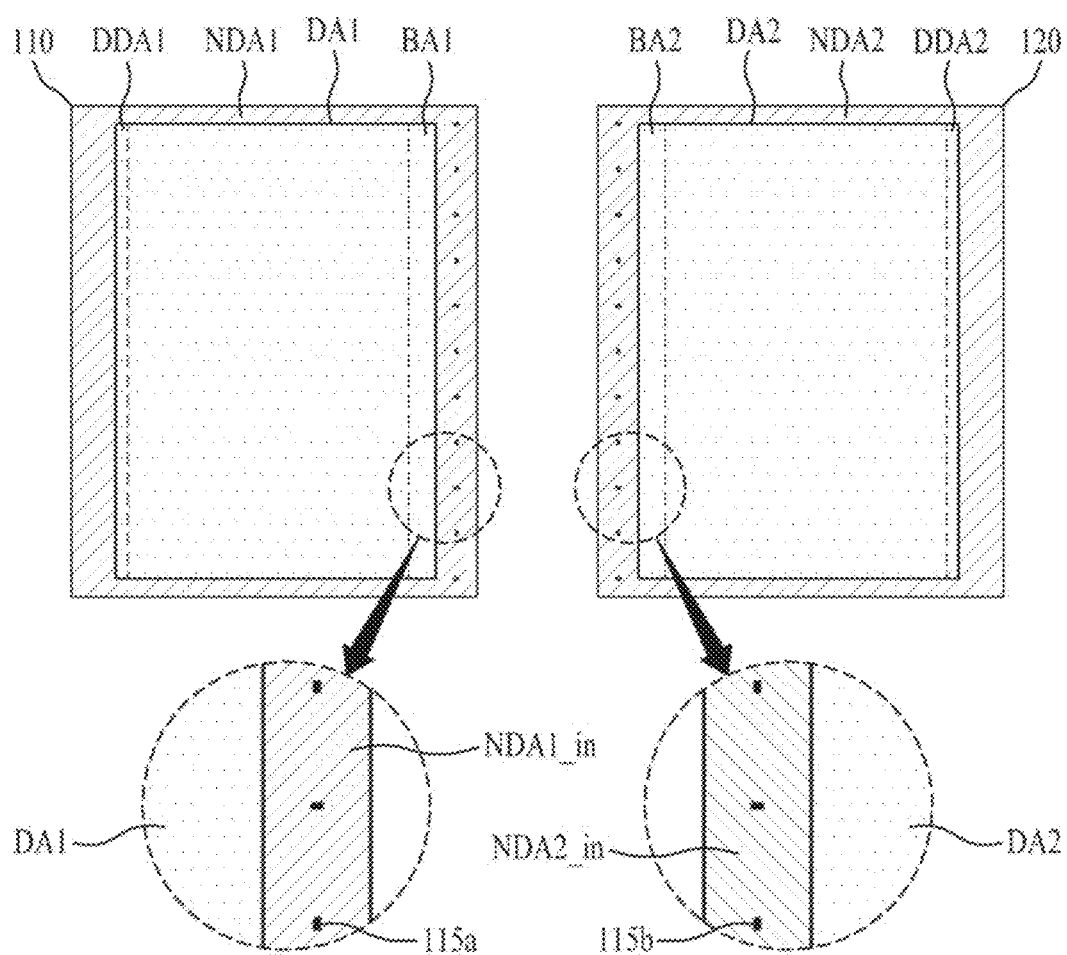
FIG. 3 is a diagram briefly illustrating first and second display panels shown in FIG. 1.

FIG. 1 is a diagram illustrating a folded state and an unfolded state of a foldable display apparatus according to the first embodiment of the present invention, FIG. 2 is a cross-sectional diagram taken along line IT shown in FIG. 1, and FIG. 3 is a diagram briefly illustrating first and second display panels shown in FIG. 1.

Referring to FIGS. 1 to 3, the foldable display apparatus according to the first embodiment of the present invention includes a first display panel 110, a second display panel 120, a first housing 210, a second housing 220, and a panel supporter 300.

Each of the first and second display panels 110 and 120 may be a flexible display panel using a flexible substrate. For example, each of the first and second display panels 110 and 120 may be a Flexible Organic Light Emitting Display Panel, a Flexible Electrophoretic Display Panel, a Flexible Liquid Crystal Display Panel, or a Flexible Electro-Wetting Display Panel.

The first and second display panels 110 and 120 are formed in a symmetric structure on the basis of the panel supporter 300, and each of the first and second display panels 110 and 120 includes a flexible substrate that includes a pixel array of a plurality of pixels for displaying images, and an encapsulation member that protects the pixel array.

The flexible substrate may be made of a plastic material or metal foil. For example, the flexible substrate of a plastic material may be made of any one of PI (Polyimide), PET (Polyethyleneterephthalate), PEN (Polyethylenapthanate), PC (Polycarbonate), PNB (Polynorborneen), and PES (Polyethersulfone).

The pixel includes a display element that displays images corresponding to image signals. In this case, the display element may be an organic light emitting element, a liquid crystal display element, an electrophoretic element, or an electro-wetting display element.

The encapsulation member is formed on the flexible substrate to cover the pixel array, and may be a flexible encapsulation substrate or an encapsulation layer.

Additionally, although each of the first and second display panels 110 and 120 may further include a polarizing film attached to the encapsulation member, the polarizing film may be omitted for flexibility of the display panels.

Meanwhile, the foldable display apparatus according to the first embodiment of the present invention may further include a touch screen for a user interface based on a touch of a user, wherein the touch screen may be attached to an upper surface of each of the first and second display panels 110 and 120 or may be embedded in each of the first and second display panels 110 and 120 together with a process of forming the pixel array.

The first display panel 110 may include a first display area DA1 and a first non-display area NDA1 surrounding the first display area DA1, wherein the first display area DA1 includes a plurality of pixels formed in a pixel region defined by gate and data lines. The first display area DA1 may be a first display screen that displays a predetermined image in accordance with driving of each pixel, which is based on driving of a panel driver (not shown) received in the first housing 210. At this time, an inner edge portion of the first display area DA1 may be a first bending area BA1 bent at a certain curvature in accordance with a bending guide of the panel supporter 300 when the first display panel 110 is unfolded. The first display panel 110 is supported by a first base plate 101 made of a flexible metal material or a flexible plastic material.

The second display panel 120 is formed to have a symmetric structure with respect to the first display panel 110, and may include a second display area DA2 and a second non-display area NDA2 surrounding the second display area DA2, wherein the second display area DA2 includes a plurality of pixels formed in a pixel region defined by gate and data lines. The second display area DA2 may be a second display screen that displays a predetermined image in accordance with driving of each pixel, which is based on driving of the panel driver (not shown) received in the first housing 210. At this time, an inner edge portion of the second display area DA2 may be a second bending area BA2 bent at a certain curvature in accordance with a bending guide of the panel supporter 300 when the second display panel 120 is unfolded. The second display panel 120 is supported by a second base plate 103 made of the same material as that of the first base plate 101.

The inner edge portions of the first and second display panels 110 and 120 are bonded to each other to face each other by a panel bonding member 150. In this case, the panel bonding member 150 may be made of a transparent adhesive, for example, a thermal hardening adhesive, an ultrasonic hardening adhesive, or an optical hardening adhesive.

If the inner edge portions of the first and second display panels 110 and 120 are bonded to each other by the panel bonding member 150, the other areas except the inner edge portions of the first and second display panels 110 and 120 may be folded or unfolded on the basis of the bonding area.

In a state that each of the first and second display panels 110 and 120 is unfolded, for example, like a book, the first and second display areas DA1 and DA2 may realize one screen. At this time, if boundary portions of the first and second display areas DA1 and DA2 are not matched with each other, images may be overlapped or not be displayed at a seam portion of the first and second display panels 110 and 120. Accordingly, the inner edge portions of the first and second display panels 110 and 120 are preferably bonded to each other such that the boundary portions of the first and second display areas DA1 and DA2 are matched with each other.

A panel bonding process according to one example, which is for bonding the inner edge portions of the first and second display panels 110 and 120 to each other, may be performed through a process of forming the panel bonding member 150 at the inner edge portion of the first and/or second display panel 110 and/or 120, an aligning process of accurately aligning a bonding position of the first and second display panels 110 and 120, and a hardening process of bonding the first and second display panels to each other by hardening the panel bonding member 150.

A panel bonding process according to another example may include a process of forming the panel bonding member 150 at the inner edge portion of the first and/or second display panel 110 and/or 120, a process of provisionally coupling the inner edge portions of the first and second display panels 110 and 120 to each other through a self-alignment manner using a magnetic force, and a hardening process of bonding the provisionally coupled inner edge portions of the first and second display panels 110 and 120 to each other by hardening the panel bonding member 150. At this time, for provisional coupling process of a self-alignment manner using a magnetic force, the foldable display apparatus according to the first embodiment of the present invention may further include a plurality of first and second magnetic thin film patterns 115a and 115b formed at the panel bonding area of the first and second display panels 110 and 120.

Each of the plurality of first and second magnetic thin film patterns 115a and 155b is preferably made of a material having a good magnetic focusing force, for example, NiFe or NiCo, etc.

The plurality of first magnetic thin film patterns 115a are formed at an inner non-display area NDA1_in of the first non-display area NDA1 which is the panel bonding area of the first display panel 110, to have a constant interval. At this time, each of the plurality of first magnetic thin film patterns 115a may be formed to have a specific shape of a figure, for example, "□", "◊", "○", "–", "|", or "+". In this case, if the plurality of first magnetic thin film patterns 115a are formed along a length direction, two neighboring first magnetic thin film patterns 115a may be formed in their respective directions different from each other. For example, if the plurality of first magnetic thin film patterns 115a are formed in a shape of "|", any one of the two neighboring magnetic thin film patterns 115a may be formed in a shape of "|", and the other one may be formed in a shape of "–". This may enable self-alignment based on the magnetic force more accurately by differently forming the magnetic forces generated in the two neighboring first magnetic thin film patterns 115a.

Since the plurality of second magnetic thin film patterns 115b are formed at an inner non-display area NDA2_in of the second non-display area NDA2 which is the panel bonding area of the second display panel 120, at a constant interval to correspond to the plurality of first magnetic thin film patterns 115a one to one, their description will be omitted.

The plurality of first and second magnetic thin film patterns 115a and 115b are bonded to each other by the magnetic force during the provisional coupling process, thereby provisionally coupling the inner edge portions of the first and second display panels 110 and 120 to each other. At this time, an alignment position between the provisionally coupled first and second display panels 110 and 120 is obtained such that the boundary portions of the first and second display areas DA1 and DA2 are matched with each other by self-alignment based on magnetic force coupling between the first and second magnetic thin film patterns 115a and 115b corresponding to each other one to one.

Additionally, the first display panel 110 may further include a first dummy display area DDA1 provided at an outer edge portion of the first display area DA1 opposite to the panel bonding member, and the second display panel 120 may further include a second dummy display area DDA2 provided at an outer edge portion of the second display area DA2 opposite to the panel bonding member. The first dummy display area DDA1 includes a plurality of pixels formed at the outer edge portion of the first display area DA1, and images are displayed or not displayed on the first dummy display area DDA1 in accordance with driving of the panel driver (not shown). Likewise, the second dummy display area DDA2 includes a plurality of pixels formed at the outer edge portion of the second display area DA2, and images are displayed or not displayed on the second dummy display area DDA2 in accordance with driving of the panel driver (not shown). On the first and second dummy display areas DDA1 and DDA2, images are displayed or not displayed in accordance with driving of the panel driver based on an image boundary compensation algorithm for matching boundary portions of the images displayed between the first and second display areas DA1 and DA2 with each other. This will be described later.

The first housing 210 receives the first display panel 110 and also surrounds a front edge portion and a side portion except the panel bonding member of the first display panel 110. To this end, the first housing 210 may include a first rear plate 212 receiving the first base plate 101 on which the first display panel 110 is supported, and a first front housing 214 surrounding the other first non-display area NDA1 except both sides of the first bending area BA1 of the first display panel 110.

The first rear plate 212 is formed of a flexible metal material or a flexible plastic material, and supports the first base plate 101. An inner edge portion of the first rear plate 212 is coupled to the panel supporter 300. As a result, the other portion except the inner edge portion of the first rear plate 212 is bent at a certain curvature in accordance with a bending guide of the panel supporter 300 when the first display panel 110 is unfolded, whereby the first bending area BA1 of the first display panel 110 is bent. In this case, the first base plate 101 on which the first display panel 110 is supported may be coupled to an entire upper surface of the first rear plate 212. However, in this case, since the first display panel 110 may be damaged without being bent when the first display panel 110 is unfolded or folded, it is preferable that the first base plate 101 on which the first display panel 110 is supported is flexibly arranged on the first rear plate 212.

The first front housing 214 is formed to surround the first non-display area NDA1 except both sides of the first bending area BA1 of the first display panel 110, for example, to surround an upper side, a left side, a lower edge portion, and a side adjacent to the lower edge portion. At this time, it is preferable that an inner side of the first front housing 214 is spaced apart from each side of the first base plate 101 and the first display panel 110 at a certain distance such that the first display panel 110 may be moved in a horizontal direction when the first display panel 110 is bent.

The second housing 220 receives the second display panel 120 and also surrounds a front edge portion and a side portion except the panel bonding member of the second display panel 120. To this end, the second housing 220 may include a second rear plate 222 receiving the second base plate 103 on which the second display panel 120 is supported, and a second front housing 224 surrounding the other second non-display area NDA2 except both sides of the second bending area BA2 of the second display panel 120.

The second rear plate 222 is formed of a flexible metal material or a flexible plastic material, and supports the second base plate 103. An inner edge portion of the second rear plate 222 is coupled to the panel supporter 300. As a result, the other portion except the inner edge portion of the second rear plate 222 is bent at a certain curvature in accordance with a bending guide of the panel supporter 300 when the second display panel 120 is unfolded, whereby the second bending area BA2 of the second display panel 120 is bent. In this case, the second base plate 103 on which the second display panel 120 is supported may be coupled to an entire upper surface of the second rear plate 222. However, in this case, since the second display panel 120 may be damaged without being bent when the second display panel 120 is unfolded or folded, it is preferable that the second base plate 103 on which the second display panel 120 is supported is flexibly arranged on the second rear plate 222.

The second front housing 224 is formed to surround the other second non-display area NDA2 except both sides of the second bending area BA2 of the second display panel 120, for example, to surround an upper side, a left side, a lower edge portion, and a side adjacent to the lower edge portion. At this time, it is preferable that an inner side of the second front housing 224 is spaced apart from each side of the second base plate 103 and the second display panel 120 at a certain distance such that the second display panel 120 may be moved in a horizontal direction when the second display panel 120 is bent.

At least one of the first and second housings 210 and 220 includes a receiving space (not shown). Driving unit (for example, communication circuit, power circuit, battery, control circuit, memory, operation circuit, etc.) used for driving the foldable display apparatus may be received in the receiving space.

Additionally, the display apparatus according to the first embodiment of the present invention may further include a first elastic housing member 230 surrounding both sides of the first bending area BA1 of the first display panel 110, and a second elastic housing member 240 surrounding both sides of the second bending area BA2 of the second display panel 120. Each of the first and second elastic housing members 230 and 240 may be formed of a flexible material which is bent in accordance with folding or unfolding of the display panels 110 and 120.

Figure 4:
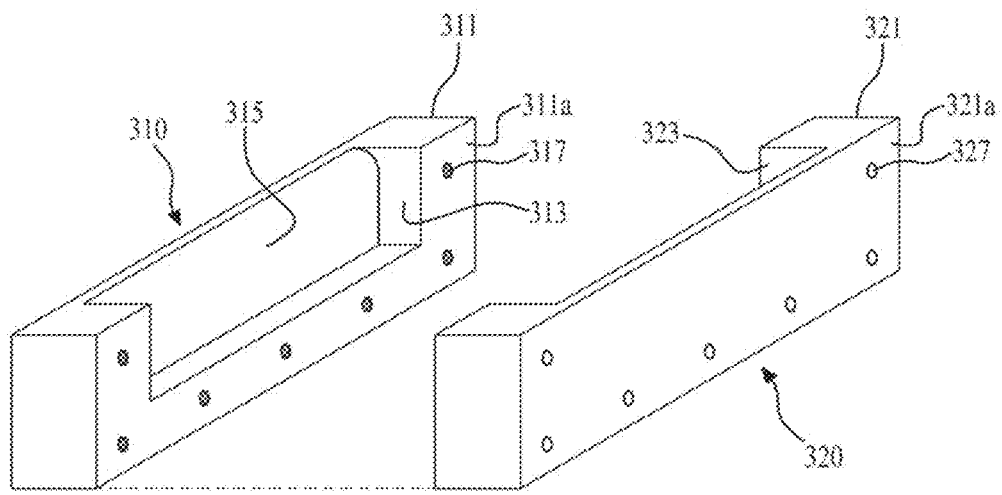
FIG. 4 is a diagram illustrating first and second support frames of a panel supporter shown in FIG. 2.

The panel supporter 300 bends or supports the inner edge portions of the first and second display panels 110 and 120, which are bonded to each other, at a certain curvature such that the first and second display panels 110 and 120 may be unfolded or folded. In more detail, the panel supporter 300 simultaneously fixes the inner edge portions of the first and second display panels 110 and 120 bonded to each other, the inner edge portions of the first and second base plates 101 and 103, and the inner edge portions of the first and second housings 210 and 220, and guides the bending areas BA1 and BA2 of the first and second display panels 110 and 120 to be bent at a certain curvature. For example, the panel supporter 300 may include a first support frame 310, a second support frame 320, and a plurality of frame coupling members 330 as shown in FIGS. 2 to 4.

The first and second support frames 310 and 320 fix the inner edge portions of the first and second display panels 110 and 120 bonded to each other while supporting the first and second display panels 110 and 120.

The first support frame 310 may include a first body 311 having a length greater than that of the inner edge portion of the first display panel 110, a first panel inserter 313 formed at a certain length and a certain depth from an inner side 311a of the first body 311 such that the inner edge portion of the first display panel 110 is inserted and arranged, a first bending guide 315 formed above an inner wall of the first panel inserter 313 to guide bending of the first display panel 110, and a plurality of first coupling holes 317 formed at the inner side 311a of the first body 311 at a certain interval.

The inner edge portions of the first display panel 110, the first base plate 101 and the first housing 210 are simultaneously inserted to the first panel inserter 313 in a vertical direction. The first bending guide 315 includes a first rounding portion 315r formed at an inner wall upper edge portion of the first panel inserter 313 at a certain curvature, wherein the first panel inserter 313 is physically in contact with the first bending area BA1 of the first display panel 110 when the first display panel 110 is unfolded.

The second support frame 320 is formed in a symmetric structure with respect to the first support frame 310, and may include a second body 321 having a length greater than that of the inner edge portion of the second display panel 120, a second panel inserter 323 formed at a certain length and a certain depth from an inner side of the second body 321 such that the inner edge portion of the second display panel 120 is inserted and arranged, a second bending guide 325 formed above an inner wall of the second panel inserter 323 to guide bending of the second display panel 120, and a plurality of second coupling holes 327 formed at an outer side 321a of the second body 321 at a certain interval.

The inner edge portions of the second display panel 120, the second base plate 103 and the second housing 220 are simultaneously inserted to the second panel inserter 323 in a vertical direction. The second bending guide 325 includes a second rounding portion 325r formed at an inner wall upper edge portion of the second panel inserter 323 at a certain curvature, wherein the second panel inserter 323 is physically in contact with the second bending area BA2 of the second display panel 120 when the second display panel 120 is unfolded.

Each of the plurality of frame coupling members 330 couples inner sides of the first and second support frames 310 and 320 to each other with the inner edge portions of the first and second display panels 110 and 120 bonded to each other, the inner edge portions of the first and second base plates 101 and 103 and the inner edge portions of the first and second housings 210 and 220, which are interposed therebetween, whereby the first and second display panels 110 and 120 are respectively fixed to the first and second support frames 310 and 320 to be bent. For example, each of the plurality frame coupling members 330 may be a screw. The screw is inserted to a second fastening hole 327 of the second support frame 320 and then fastened to a first fastening hole 317 of the second support frame 320, thereby coupling the first and second support frames 310 and 320 to each other.

Figure 5A:
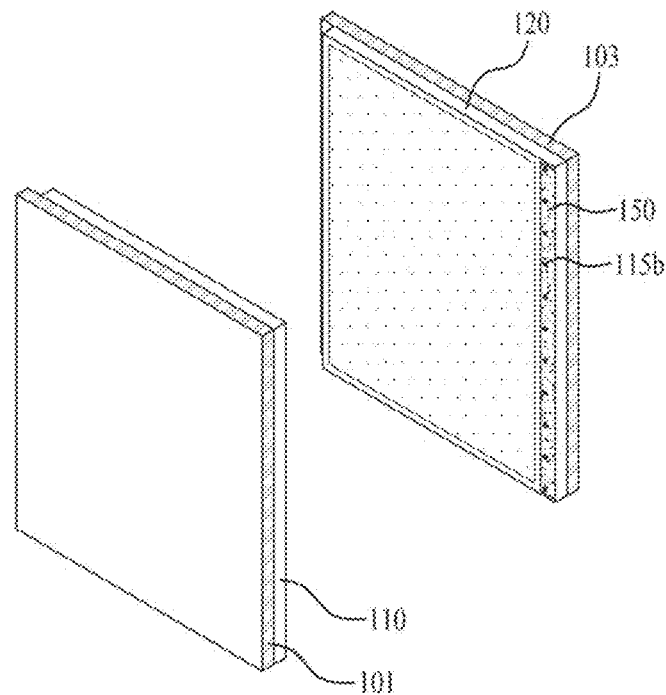
FIGS. 5A to 5C are diagrams illustrating a method for bonding first and second display panels to each other in a foldable display apparatus according to the first embodiment of the present invention.
Figure 5B:
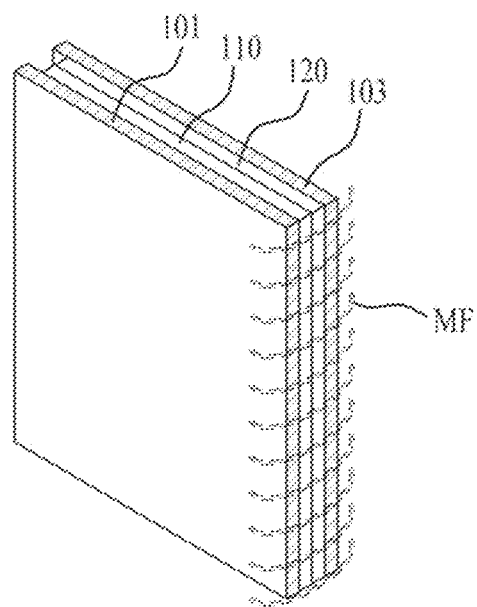
Figure 5C:
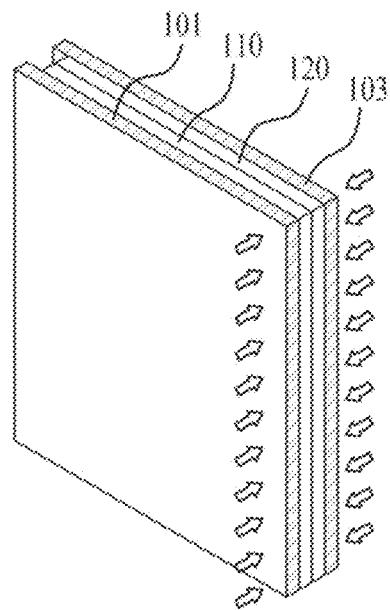

FIGS. 5A to 5C are diagrams illustrating a method for bonding first and second display panels to each other in a foldable display apparatus according to the first embodiment of the present invention. Hereinafter, a bonding method of the first and second display panels 110 and 120 will be described.

First of all, as shown in FIG. 5A, a panel bonding member 150 is deposited on the inner edge portion of the second display panel 120 on which the plurality of second magnetic thin film patterns 115b are formed. At this time, the panel bonding member 150 may additionally be deposited on the inner edge portion of the first display panel 110 on which the plurality of first magnetic thin film patterns 115a are formed. In this case, the first display panel 110 is supported on the first base plate 101, and the second display panel 120 is supported on the second base plate 103.

Then, as shown in FIG. 5B, the first and second display panels 110 and 120 are bonded to each other to face each other such that the boundary portions of the first display area of the first display panel 110 and the second display area of the second display panel 120 are matched with each other. As a result, the inner edge portions of the first and second display panels 110 and 120 are self-aligned by the magnetic force MF generated in the plurality of first and second magnetic thin film patterns formed to correspond to each other one to one, and are provisionally coupled to each other by being bonded to each other to face each other.

Then, as shown in FIG. 5C, the panel bonding member 150 deposited between the inner edge portions of the first and second display panels 110 and 120 provisionally coupled to each other is hardened using heat, ultrasonic waves, or light, whereby the inner edge portions of the first and second display panels 110 and 120 are bonded to each other.

After the panel bonding process is performed as above, each of the first and second display panels 110 and 120 of which inner edge portions are bonded to each other is received in its corresponding housing 210 or 220, and the inner edge portions of the first and second housings 210 in which the first and second display panels 110 and 120 are received are fixed to the panel supporter 300.

Figure 6:
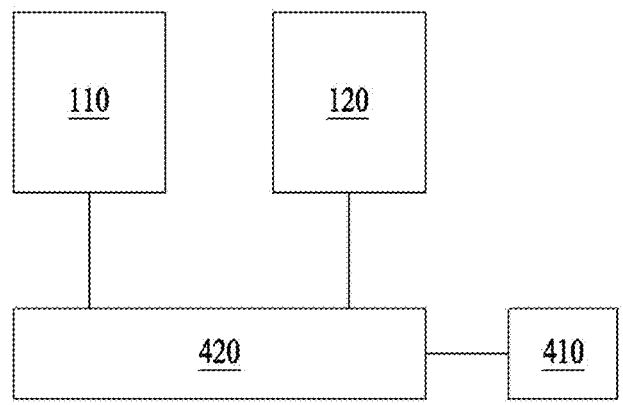
FIG. 6 is a diagram illustrating a driving device of a foldable display apparatus according to the first embodiment of the present invention.

FIG. 6 is a diagram illustrating a driving device of a foldable display apparatus according to the first embodiment of the present invention.

Referring to FIG. 6 in association with FIGS. 1 to 3, the driving device of the foldable display apparatus according to the first embodiment of the present invention includes a memory 410 and a panel driver 420.

The memory 410 stores alignment information on the boundary portions of the first display area DA1 of the first display panel 110 and the second display area DA2 of the second display panel 120. In this case, the alignment information may be a reference value to be performed for the image boundary compensation algorithm for matching the boundary portions of the images displayed between the first and second display areas DA1 and DA2 witch each other by using the first and second dummy display areas DDA1 and DDA2. A process of generating the alignment information will be described as follows.

First of all, in a state that the first and second display panels 110 and 120 are unfolded, an image of one screen is split into two images in a left and right direction to generate first and second split images, and the generated first and second split images are displayed on the first and second display areas DA1 and DA2.

Then, boundary images of the first and second display areas DA1 and DA2 are obtained using an optical measurement device, and the obtained boundary images are analyzed to obtain the number of image overlap lines or the number of image damage lines.

Next, each of the first and second split images displayed on the first and second display areas DA1 and DA2 is shifted in a left and right direction based on the number of image overlap lines or the number of image damage lines, whereby alignment information for matching the boundary portions of the images displayed between the first and second display areas DA1 and DA2 with each other is obtained.

Finally, the obtained alignment information is stored in the memory 410.

The panel driver 420 realizes one seamless screen on the first and second display areas DA1 and DA2 by displaying images on each of the first and second display panels 110 and 120 when the first and second display panels 110 and 120 are unfolded. At this time, in realizing one seamless screen, the panel driver 420 shifts the split images displayed on the first and second display areas DA1 and DA2 in a left and right direction and matches the boundary portions of the images displayed between the first and second display areas DA1 and DA2 witch each other in accordance with the alignment information stored in the memory 410 by using the first and second dummy display areas DDA1 and DDA2 of the first and second display panels 110 and 120 on the basis of the image boundary compensation algorithm, thereby compensating for picture quality deterioration of the image boundary portions.

Figure 7:
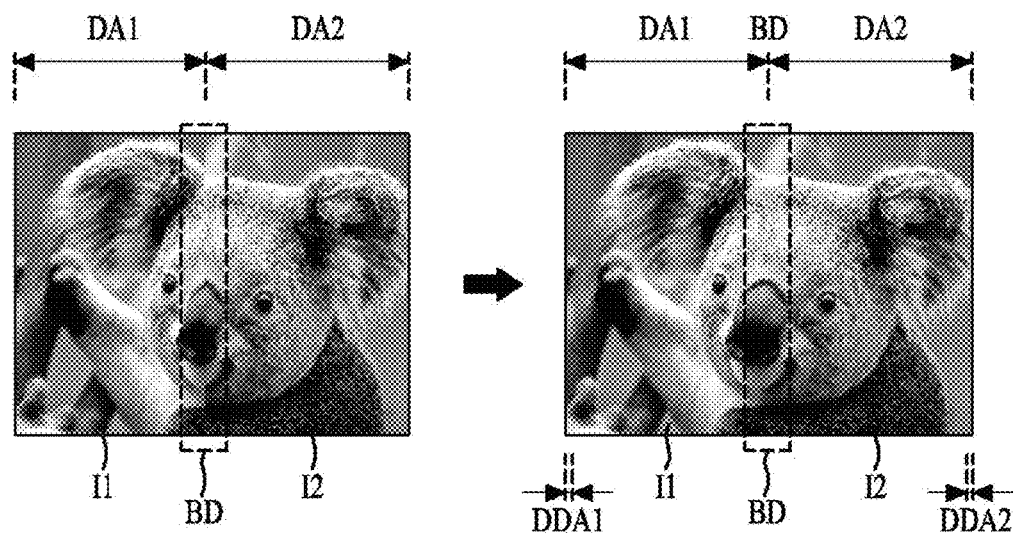
FIG. 7 is a diagram illustrating an image boundary compensation algorithm according to a panel driver shown in FIG. 6.

For example, as shown at the left side of FIG. 7, if some line of the split images I1 and I2 displayed on the first and second display areas DA1 and DA2 is damaged as the boundary portions BD of the first and second display areas DA1 and DA2 are not matched with each other, the split images I1 and I2 are overlapped with each other or damaged at the boundary portions BD of the first and second display areas DA1 and DA2 if the image boundary compensation algorithm is not used, whereby picture quality of the image boundary portions may be deteriorated. However, as shown at the right side of FIG. 7, if the image boundary compensation algorithm based on the alignment information stored in the memory 410 is used, the split images I1 and I2 displayed on the boundary portion BD of the first and second display areas DA1 and DA2 are shifted to the dummy display areas DDA1 and DDA2 in accordance with the alignment information, whereby the boundary portions of the images displayed between the first and second display areas DA1 and DA2 are matched with each other. As a result, one seamless image is displayed between the first and second display areas DA1 and DA2.

As described above, according to the first embodiment of the present invention, the inner edge portions of the first and second display panels 110 and 120 are bonded to each other, and the edge portion at one side of each of the first and second display panels 110 and 120 bonded to each other is fixed to the panel supporter 300 such that the first and second display panels 110 and 120 may be unfolded on the basis of the panel bonding member, whereby one seamless large screen may be realized using the two display panels 110 and 120.

Also, according to the first embodiment of the present invention, as the two display panels 110 and 120 are bent in accordance with the curvature of the bending guides 315 and 325 formed in the panel supporter 300 without being fully folded, stress given to the bending areas BA1 and BA2 of the first and second display panels 110 and 120 is minimized, whereby crack generated in the bending areas may be minimized and thus reliability of the display panels may be improved.

Also, according to the first embodiment of the present invention, the edge portions at one sides of the first and second display panels 110 and 120 are bonded to each other through the self-alignment manner based on the magnetic thin film patterns 115a and 115b, whereby the boundary portions of the first display area DA1 of the first display panel 110 and the second display area DA2 of the second display panel 120 may easily be matched with each other.

Also, according to the first embodiment of the present invention, the split images displayed on the first and second display areas DA1 and DA2 are shifted in a left and right direction to match the boundary portions of the images displayed between the first and second display areas DA1 and DA2 with each other through the image boundary compensation algorithm based on the alignment information and the first and second dummy display areas DDA1 and DDA2, whereby one seamless image may be displayed between the first and second display areas DA1 and DA2.

Figure 8:
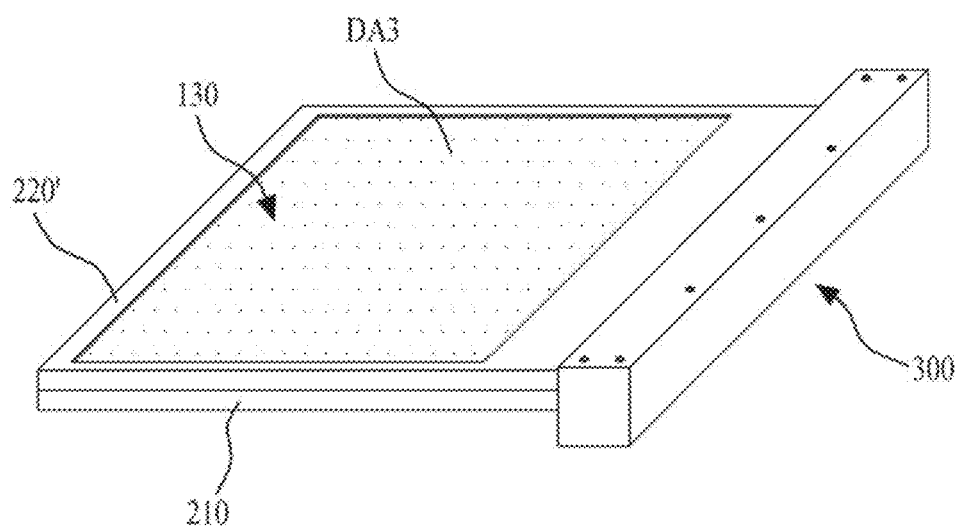
FIG. 8 is a diagram illustrating a folded state of a foldable display apparatus according to a second embodiment of the present invention.

FIG. 8 is a diagram illustrating a folded state of a foldable display apparatus according to the second embodiment of the present invention, in which a third display panel is additionally provided in the foldable display apparatus according to the first embodiment of the present invention and a structure of the second housing is changed. In the description according to the second embodiment of the present invention, the description of elements the same as or corresponding to those of the first embodiment will be omitted. Hereinafter, the third display panel 130 and the second housing 220' will be described.

The third display panel 130 is formed to include a third display area DA3 that includes a plurality of pixels formed in a pixel region defined by gate and data lines, and is arranged on a rear surface of the second base plate 130, whereby a display screen is provided on a rear surface of the second housing 220' in a state that the foldable display apparatus is folded. At this time, the third display panel 130 is provided in the same manner as the second display panel 120, but formed to have an area relatively smaller than that of the second display panel 120, and may be attached to the rear surface of the second base plate 103, which is not bent, except the inner edge portion of the second base plate 103 which is bent. That is, the third display panel 130 may be attached to the rear surface of the second base plate 103 that maintains a flat state without being bent.

The second housing 220' is formed to have the same structure as that of the second housing 220 of the first embodiment but may further include a rear opening for externally exposing the third display area DA3 of the third display panel 130. Accordingly, in a state that the first and second display panels are folded, the image is displayed on the rear surface of the second housing 220' by driving of the third display panel 130.

As described above, the foldable display device according to the second embodiment of the present invention may provide the same effect as that of the foldable display apparatus according to the first embodiment of the present invention and display the image on the rear surface of the second housing 220' through the third display panel 130 even in a state that the first and second display panels 110 and 120 are folded.

Figure 9:
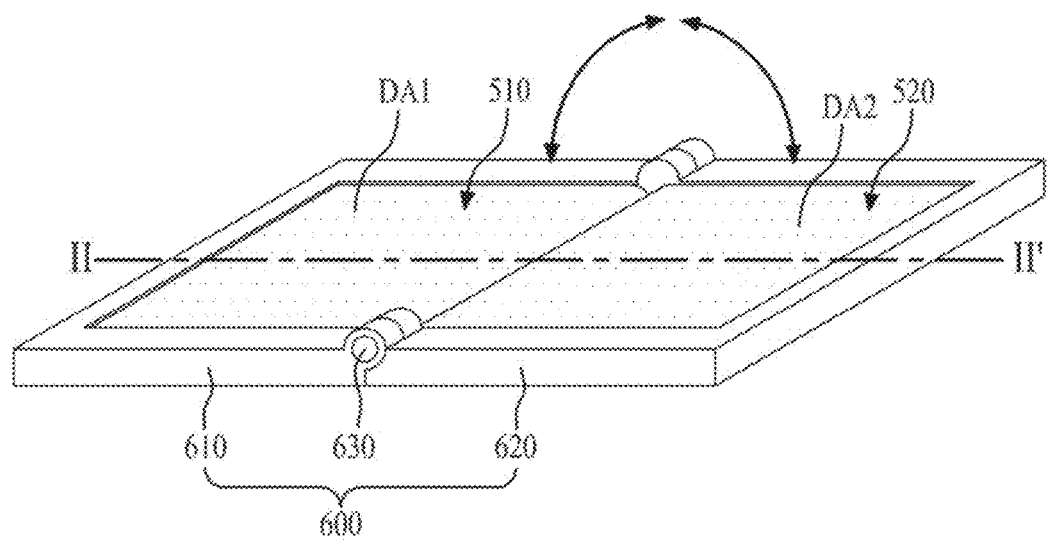
FIG. 9 is a diagram illustrating an unfolded state of a foldable display apparatus according to a third embodiment of the present invention.
Figure 10:
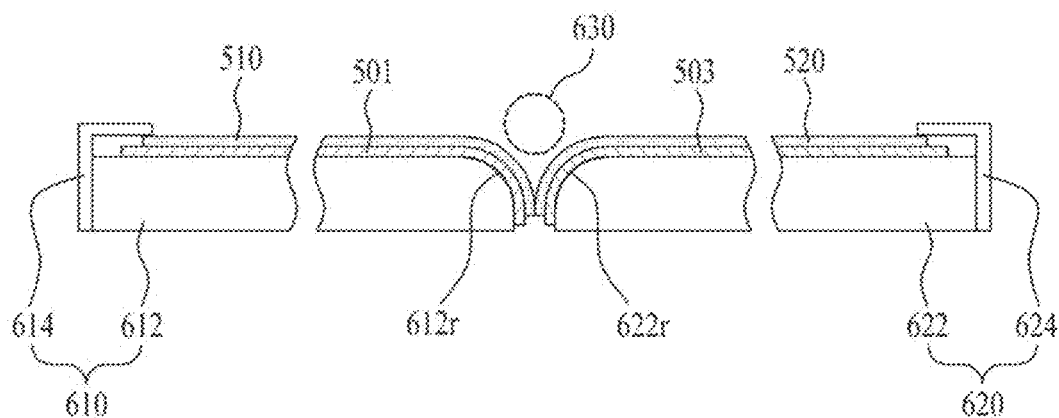
FIG. 10 is a cross-sectional diagram taken along line II-II' shown in FIG. 9.
Figure 11:
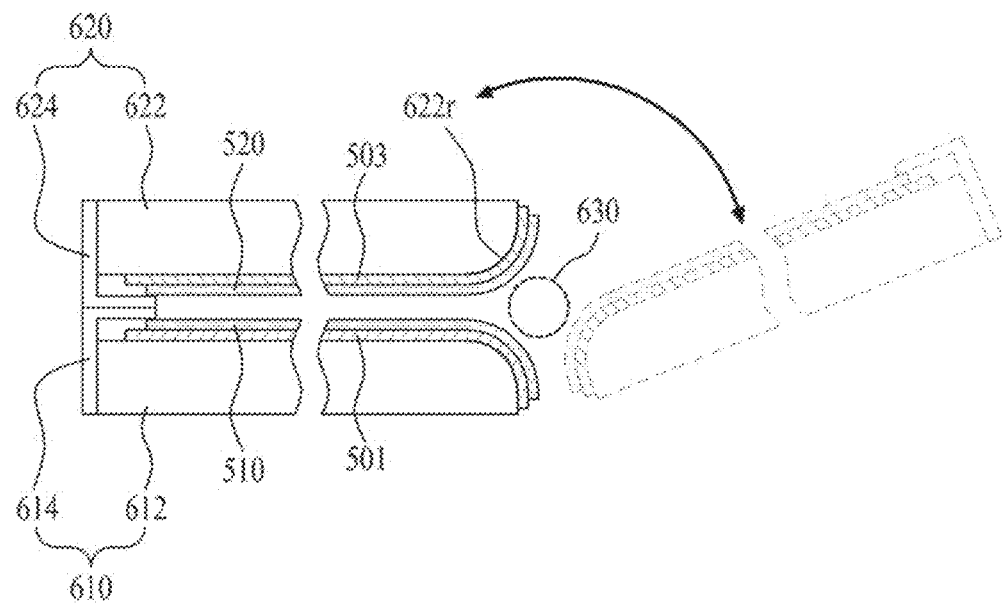
FIG. 11 is a diagram illustrating a folded state of a foldable display apparatus according to the third embodiment of the present invention.

FIG. 9 is a diagram illustrating an unfolded state of a foldable display apparatus according to the third embodiment of the present invention, FIG. 10 is a cross-sectional diagram taken along line II-II' shown in FIG. 9, and FIG. 11 is a diagram illustrating a folded state of a foldable display apparatus according to the third embodiment of the present invention.

Referring to FIGS. 9 to 11, the foldable display apparatus according to the third embodiment of the present invention includes a first display panel 510, a second display panel 520, and a panel supporter 600.

Each of the first and second display panels 510 and 520 may be a flexible display panel using the same flexible substrate as that of the first embodiment. Each of the first and second display panels 510 and 520 is formed in a symmetric structure on the basis of the panel supporter 600. Since the first display panel 510 includes a first display area DA1, a first non-display area NDA1 and a first bending area BA1 in the same manner as the first embodiment shown in FIG. 3 except that the plurality of first magnetic thin film patterns 115a are omitted, its repeated description will be omitted. Likewise, since the second display panel 520 includes a second display area DA2, a second non-display area NDA2 and a second bending area BA2 in the same manner as the first embodiment shown in FIG. 3 except that the plurality of second magnetic thin film patterns 115b are omitted, its repeated description will be omitted.

The first display panel 510 may be supported on or attached to a first base plate 501 made of a metal material, a plastic material, a flexible metal material, or a flexible plastic material. Likewise, the second display panel 520 may be supported on or attached to a second base plate 503 made of the same material as that of the first base plate 501.

The panel supporter 600 bends an inner edge portion of the first display panel 510 and an inner edge portion of the second display panel 520, which face each other, at a certain curvature such that the first and second display panels 510 and 520 may be unfolded or folded, and also supports the inner edge portions of the first and second display panels 510 and 520, thereby matching boundary portions of the first display area DA1 of the first display panel 510 and the second display area DA2 of the second display panel 520 witch each other. For example, the panel supporter 600 may include a first housing 610, a second housing 620, and a hinge unit 630.

The first housing 610 receives the first display panel 510 and also surrounds a front edge portion and a side portion except the inner edge portion of the first display panel 510. To this end, the first housing 610 may include a first rear plate 612 receiving the first base plate 501 on which the first display panel 510 is supported, and a first front housing 614 surrounding the other first non-display area NDA1 except the inner edge portion of the first display panel 510.

The first rear plate 612 may be formed of a metal material, a plastic material, a flexible metal material or a flexible plastic material. The first rear plate 612 is coupled to the rear surface of the first base plate 501 that supports the first display panel 510. At this time, the first display panel 510 is aligned to be located at a coupling position set such that the boundary portions of the first and second display areas DA1 and DA2 are matched with each other.

An upper edge portion at an inner side of the first rear plate 612 includes a first rounding portion 612r formed to have a certain curvature. Accordingly, the first base plate 501 and the first display panel 510 are coupled to a front surface of the first rear plate 610 that includes the first rounding portion 612r, whereby the first bending area BA1 of the first display panel 510 is bent at a curvature corresponding to the curvature of the first rounding portion 612r and also maintained at the bent state. As a result, the first display panel 510 is rotated around the hinge unit 630 as the first bending area BA1 is bent at a certain curvature by the first rounding portion 612r.

The first front housing 614 surrounds a third side except the rear surface of the first rear plate 612 and also surrounds the other first non-display area NDA1 except the inner edge portion of the first display panel 510.

The second housing 620 receives the second display panel 520 and also surrounds a front edge portion and a side portion except the inner edge portion of the second display panel 520. To this end, the second housing 620 may include a second rear plate 622 receiving the second base plate 503 on which the second display panel 520 is supported, and a second front housing 624 surrounding the other second non-display area NDA2 except the inner edge portion of the second display panel 520.

The second rear plate 622 is formed of the same material as that of the first rear plate 612, and is coupled to the rear surface of the second base plate 503 that supports the second display panel 520. At this time, the second display panel 520 is aligned to be located at a coupling position set such that the boundary portions of the first and second display areas DA1 and DA2 are matched with each other.

An upper edge portion at an inner side of the second rear plate 622 includes a second rounding portion 622r formed to have a certain curvature. Accordingly, the second base plate 503 and the second display panel 520 are coupled to a front surface of the second rear plate 622 that includes the second rounding portion 622r, whereby the second bending area BA2 of the second display panel 520 is bent at a curvature corresponding to the curvature of the second rounding portion 622r and also fixed at the bent state. As a result, the second display panel 520 is rotated around the hinge unit 630 as the second bending area BA2 is bent at a certain curvature by the second rounding portion 622r.

The second front housing 624 surrounds a third side except the rear surface of the second rear plate 622 and also surrounds the other second non-display area NDA2 except the inner edge portion of the second display panel 520.

The hinge unit 630 is connected between the first and second housings 610 and 620 and rotatably supports each of the first and second housings 610 and 620, whereby the first and second display panels 510 and 520 may be folded or unfolded.

Additionally, the foldable display apparatus according to the third embodiment of the present invention may further include a memory 410 and a panel driver 420, which are shown in FIG. 6. Accordingly, in the same manner as the disclosure described with reference to FIGS. 6 and 7, the foldable display apparatus according to the third embodiment of the present invention matches the boundary portions of the images displayed between the first and second display areas DA1 and DA2 with each other by shifting the split images displayed on the first and second display areas DA1 and DA2 in a left and right direction through the image boundary compensation algorithm based on the alignment information and the first and second dummy display areas DDA1 and DDA2, whereby one seamless image may be displayed between the first and second display areas DA1 and DA2.

As described above, according to the third embodiment of the present invention, the inner edge portions of the first and second display panels 510 and 520 are bent at a certain curvature to match the boundary portions of the two display areas DA1 and DA2, which are spaced apart from each other, with each other, and then are coupled to the housings 610 and 620 to unfold the first and second display panels 510 and 520 on the basis of the hinge unit 630, whereby one seamless large screen may be realized using the two display panels 510 and 520.

Also, according to the third embodiment of the present invention, the two display panels 510 and 520 are not folded completely, and the inner edge portions of the first and second display panels 510 and 520 are fixed at the bent state of a certain curvature, whereby stress is not given to the bending areas BA1 and BA2 of the first and second display panels 510 and 520 when the first and second panels 510 and 520 are unfolded or folded, and thus reliability of the display panels may be more improved.

As described above, the advantages according to the foldable display apparatus of the embodiments of the present invention may be obtained as follows.

Firstly, the inner edge portions of the first and second display panels are bonded to each other, and the edge portions at one sides of the first and second display panels bonded to each other are only fixed to the panel supporter to unfold the first and second display panels on the basis of the panel bonding member, whereby one seamless large screen may be realized using the two display panels.

Secondly, the two display panels are bent in accordance with the curvature of the bending guide formed in the panel supporter without being fully folded, whereby stress given to the bending areas of the display panels and crack caused by stress may be minimized and thus reliability of the display panels may be improved.

Thirdly, the inner edge portions of the first and second display panels are bent at a certain curvature to match the boundary portions of the two display areas, which are spaced apart from each other, with each other, and then are coupled to the housings to unfold the first and second display panels on the basis of the hinge unit, whereby one seamless large screen may be realized using the two display panels.

Finally, the boundary portions of the images displayed between the first and second display areas are matched with each other through the image boundary compensation algorithm, whereby one seamless large image may be realized using the two display panels.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A foldable display apparatus comprising:
   a first display panel having a first display area;
   a second display panel having a second display area,
   wherein inner edge portions of the first and second display panels are bonded to each other by a panel bonding member made of an adhesive and disposed between the inner edge portions of the first and second display panels; and
   a panel supporter supporting the first and second display panels to mutually fold or unfold the first and second display panels,
   wherein boundary portions of the first display area of the first display panel and the second display area of the second display panel are matched with each other in a state that the first and second display panels are unfolded.

2. The foldable display apparatus of claim 1, wherein the inner edge portions of the first and second display panels match the boundary portions of the first and second display areas with each other.

3. The foldable display apparatus of claim 2, wherein the panel supporter includes:
   first and second support frames for fixing the inner edge portions of the first and second display panels bonded to each other; and
   a plurality of frame coupling members coupling the first and second support frames to each other with the inner edge portions of the first and second display panels, which are interposed therebetween.

4. The foldable display apparatus of claim 3, wherein each of the first and second support frames includes a bending guide guiding bending of its corresponding display panel when the corresponding display panel is unfolded.

5. The foldable display apparatus of claim 4, wherein the bending guide includes a rounding portion provided at an edge portion of the corresponding support frame, which is in contact with the corresponding display panel, at a certain curvature.

6. The foldable display apparatus of claim 3, wherein,
the first display panel further includes a plurality of first magnetic thin film patterns provided at the inner edge portion at a constant interval to align the first and second display areas, and
the second display panel further includes a plurality of second magnetic thin film patterns provided at the inner edge portion at a constant interval to correspond to the plurality of first magnetic thin film patterns one to one.

7. The foldable display apparatus of claim 1, wherein the panel supporter includes:
a first housing supporting the first display panel and coupled to the inner edge portion of the first display panel bent at a certain curvature;
a second housing supporting the second display panel and coupled to the inner edge portion of the second display panel bent at a certain curvature; and
a hinge unit connected between the first and second housings to fold or unfold the first and second display panels,
wherein each of the inner edge portions of the first and second display panels is bent to match the boundary portions of the first and second display areas with each other.

8. The foldable display apparatus of claim 7, wherein each of the first and second housings includes a rounding portion provided to have a certain curvature, and the inner edge portion of each of the first and second display panels maintains its bent state in accordance with the curvature of the rounding portion.

9. The foldable display apparatus of claim 1, wherein,
the first display panel further includes a first dummy display area provided at an outer edge portion of the first display area, which is opposite to the inner edge portion of the first display area, and
the second display panel further includes a second dummy display area provided at an outer edge portion of the second display area, which is opposite to the inner edge portion of the second display area.

10. The foldable display apparatus of claim 9, further comprising:
a memory for storing alignment information on the boundary portions of the first and second display areas; and
a panel driver for driving each of the first and second display panels,
wherein the panel driver matches boundary portions of images displayed between the first and second display areas with each other by shifting the images to be displayed on the first and second display areas to the first and second dummy display areas on the basis of the alignment information when the first and second display panels are unfolded.

11. A foldable display apparatus comprising:
a first display panel having a first display area;
a second display panel having a second display area,
wherein inner edge portions of the first and second display panels are bonded to each other by a panel bonding member made of an adhesive and disposed between the inner edge portions of the first and second display panels;
first and second support frames for supporting the first and second display panels to mutually fold or unfold the first and second display panels, wherein the first and second support frames are configured to fix the inner edge portions of the first and second display panels bonded to each other; and
a plurality of frame coupling members coupling the first and second support frames to each other with the inner edge portions of the first and second display panels,
wherein boundary portions of the first display area of the first display panel and the second display area of the second display panel are matched with each other in a state that the first and second display panels are unfolded.

12. The foldable display apparatus of claim 11, wherein the inner edge portions of the first and second display panels match the boundary portions of the first and second display areas with each other.

13. The foldable display apparatus of claim 11, wherein each of the first and second support frames includes a bending guide guiding bending of its corresponding display panel when the corresponding display panel is unfolded.

14. The foldable display apparatus of claim 13, wherein the bending guide includes a rounding portion provided at an edge portion of the corresponding support frame, which is in contact with the corresponding display panel, at a certain curvature.

15. The foldable display apparatus of claim 11, wherein,
the first display panel further includes a plurality of first magnetic thin film patterns provided at the inner edge portion at a constant interval to align the first and second display areas, and
the second display panel further includes a plurality of second magnetic thin film patterns provided at the inner edge portion at a constant interval to correspond to the plurality of first magnetic thin film patterns one to one.

16. The foldable display apparatus of claim 11, further comprising:
a first housing supporting the first display panel and coupled to the inner edge portion of the first display panel bent at a certain curvature;
a second housing supporting the second display panel and coupled to the inner edge portion of the second display panel bent at a certain curvature; and
a hinge unit connected between the first and second housings to fold or unfold the first and second display panels,
wherein each of the inner edge portions of the first and second display panels is bent to match the boundary portions of the first and second display areas with each other.

17. The foldable display apparatus of claim 16, wherein each of the first and second housings includes a rounding portion provided to have a certain curvature, and the inner edge portion of each of the first and second display panels maintains its bent state in accordance with the curvature of the rounding portion.

18. The foldable display apparatus of claim 11, wherein,
the first display panel further includes a first dummy display area provided at an outer edge portion of the first display area, which is opposite to the inner edge portion of the first display area, and
the second display panel further includes a second dummy display area provided at an outer edge portion of the second display area, which is opposite to the inner edge portion of the second display area.

19. The foldable display apparatus of claim 18, further comprising:
a memory for storing alignment information on the boundary portions of the first and second display areas; and
a panel driver for driving each of the first and second display panels,
wherein the panel driver matches boundary portions of images displayed between the first and second display areas with each other by shifting the images to be displayed on the first and second display areas to the first and second dummy display areas on the basis of the alignment information when the first and second display panels are unfolded.

20. The foldable display apparatus of claim 11, wherein the panel bonding member matches the boundary portions of the first and second display areas with each other.

\* \* \* \* \*